United States Patent
Gopalraja et al.

(12) 
(10) Patent No.: US 6,660,134 B1
(45) Date of Patent: *Dec. 9, 2003

(54) FEEDTHROUGH OVERLAP COIL

(75) Inventors: Praburam Gopalraja, San Jose, CA (US); Zheng Xu, Foster City, CA (US); Michael Rosenstein, Sunnyvale, CA (US); John C. Forster, San Francisco, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/113,577

(22) Filed: Jul. 10, 1998

(51) Int. Cl.[7] .................. C23C 14/00; C23C 14/32; C23C 16/00
(52) U.S. Cl. ................. 204/192.12; 204/298.06; 204/298.08; 118/723 I
(58) Field of Search ............ 209/192.12, 298.06, 209/298.16, 298.19, 298.08; 118/723 I, 723 IR, 723 AN (56) References Cited

U.S. PATENT DOCUMENTS

| | | |
|---|---|---|
| 118,252 A | 8/1871 | Lewis |
| 565,698 A | 8/1896 | Sparks |
| 4,154,011 A | 5/1979 | Rakestraw et al. |
| 4,361,472 A | 11/1982 | Morrison, Jr. |
| 4,422,896 A | 12/1983 | Class et al. |
| 4,478,437 A | 10/1984 | Skinner |

(List continued on next page.)

FOREIGN PATENT DOCUMENTS

| | | |
|---|---|---|
| EP | 0520519 | 12/1992 |
| EP | 0601595 | 12/1993 |
| EP | 0607797 | 7/1994 |
| EP | 0653776 | 5/1995 |
| EP | 0727807 | 8/1996 |
| EP | 0727923 | 8/1996 |
| EP | 0758148 | 2/1997 |
| EP | 0807954 | 11/1997 |
| EP | 0-813-227 | * 12/1997 |
| EP | 0836218 | 4/1998 |
| EP | 0836219 | 4/1998 |
| EP | 0840351 | 5/1998 |
| GB | 2231197 | 11/1990 |
| JP | 59190363 | 10/1984 |
| JP | 61190070 | 8/1986 |
| JP | 6232055 | 8/1994 |
| JP | 6283470 | 10/1994 |
| JP | 7176398 | 7/1995 |
| JP | 7176399 | 7/1995 |
| JP | 7-245271 | 9/1995 |
| JP | 8088190 | 4/1996 |
| JP | 8153712 | 6/1996 |
| JP | 8288259 | 11/1996 |
| WO | 8606923 | 11/1986 |

OTHER PUBLICATIONS

S.M. Rossnagel et al., "Magnetron Sputter Deposition with High Levels of Metal Ionization," *Appl. Phys. Lett.*, vol. 63, pp. 3285–3287, 1993.

(List continued on next page.)

*Primary Examiner*—Patrick Ryan
*Assistant Examiner*—Julian A. Mercado
(74) *Attorney, Agent, or Firm*—Konrad, Raynes, Victor & Mann (57) ABSTRACT

A coil for inductively coupling RF energy to a plasma in a substrate processing chamber has adjacent spaced and circumferentially overlapping RF feedthroughs adjacent to overlapping ends to improve uniformity of processing of the substrate.

60 Claims, 5 Drawing Sheets

U.S. PATENT DOCUMENTS

| | | |
|---|---|---|
| 4,948,458 A | 8/1990 | Ogle |
| 4,990,229 A | 2/1991 | Campbell et al. |
| 4,999,096 A | 3/1991 | Nihei et al. |
| 5,001,816 A | 3/1991 | Oetiker |
| 5,102,496 A | 4/1992 | Savas |
| 5,122,251 A | 6/1992 | Campbell et al. |
| 5,135,634 A | 8/1992 | Clarke |
| 5,146,137 A | 9/1992 | Gesche et al. |
| 5,150,503 A | 9/1992 | Müller |
| 5,178,739 A | 1/1993 | Barnes et al. |
| 5,198,725 A | 3/1993 | Chen et al. |
| 5,231,334 A | 7/1993 | Paranjpe |
| 5,234,560 A | 8/1993 | Kadlec et al. |
| 5,241,245 A | 8/1993 | Barnes et al. |
| 5,280,154 A | 1/1994 | Cuomo et al. |
| 5,304,279 A | 4/1994 | Coultas et al. |
| 5,346,578 A | 9/1994 | Benzing et al. |
| 5,397,962 A | 3/1995 | Moslehi |
| 5,401,350 A | 3/1995 | Patrick et al. |
| 5,404,079 A | 4/1995 | Ohkuni et al. |
| 5,418,431 A | 5/1995 | Williamson et al. |
| 5,429,070 A | 7/1995 | Campbell et al. |
| 5,429,995 A | 7/1995 | Nishiyama et al. |
| 5,430,355 A | 7/1995 | Paranjpe |
| 5,433,812 A | 7/1995 | Cuomo et al. |
| 5,434,353 A | 7/1995 | Kraus |
| 5,556,501 A | 9/1996 | Collins et al. |
| 5,637,961 A | 6/1997 | Ishii et al. |
| 5,669,975 A | 9/1997 | Ashtiani |
| 5,681,393 A | 10/1997 | Takagi |
| 5,683,537 A | 11/1997 | Ishii |
| 5,688,357 A * | 11/1997 | Hanawa ................. 156/345 |
| 5,690,781 A | 11/1997 | Yoshida et al. |
| 5,707,498 A | 1/1998 | Ngan |
| 5,721,021 A | 2/1998 | Tobe et al. |
| 5,753,044 A * | 5/1998 | Hanawa et al. ........... 118/723 I |
| 5,770,098 A | 6/1998 | Araki et al. |
| 5,783,492 A | 7/1998 | Higuchi et al. |
| 5,810,931 A | 9/1998 | Stevens et al. |
| 5,961,793 A * | 10/1999 | Ngan ................. 204/192.12 |
| 6,077,402 A * | 6/2000 | Hong et al. ............ 204/192.12 |
| 6,146,508 A * | 11/2000 | Gopalraja et al. ...... 204/298.06 |
| D440,582 S * | 4/2001 | Gopalraja et al. ...... D15/144.2 |
| 6,210,539 B1 * | 4/2001 | Tanaka et al. ......... 204/192.12 |
| D442,852 S * | 5/2001 | Gopalraja et al. ............ D8/395 |
| D442,853 S * | 5/2001 | Gopalraja et al. ............ D8/395 |
| 6,228,229 B1 * | 5/2001 | Raaijmakers et al. .. 204/192.12 |
| 6,254,737 B1 * | 7/2001 | Edelstein et al. ...... 204/192.12 |
| D450,070 S * | 11/2001 | Gopalraja et al. ...... D15/144.2 |

OTHER PUBLICATIONS

J. Hopwood et al., "Mechanisms for Highly Ionized Magnetron Sputtering," *J. Appl. Phys.*, vol. 78, pp. 758–795, 1995.

S.M. Rossnagel, "Directional and Ionized Sputter Deposition for Microelectronics Applications," *Proc. of 3rd ISSP (Tokyo)*, pp. 253–260, 1995.

N. Jiwari et al., "Helicon wave plasma reactor employing single–loop antenna," *J. of Vac. Sci. Technol.*, A 12(4), pp. 1322–1327, Jul./Aug. 1994.

U.S. patent application Ser. No. 08/857,944, filed May 16, 1997.

U.S. patent application Ser. No. 09/039,695, filed Mar. 16, 1998.

Applied Materials, Inc., Exhibit A, Dated prior to Jul. 13, 1998, the filiing date of the present application. (Exhibit A is a drawing of a prior art coil design which is prior to the design of the present application.).

U.S. patent application Ser. No. 29/109,892, filed Aug. 24, 1999.

PCT/US99/14921: Written Opinion dated Jun. 15, 2000.

English translation of Office Action from the Patent Office of the People's Republic of China, No. 99810434.5, dated Oct. 18, 2002.

* cited by examiner

FEEDTHROUGH OVERLAP COIL

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created within the plasma impact the surface of the target to dislodge, i.e., "sputter" material from the target. The sputtered materials are then transported and deposited on the surface of the semiconductor wafer.

Sputtered material has a tendency to travel in straight line paths from the target to the substrate on which they are being deposited at angles which are oblique to the surface of the substrate. As a consequence, materials deposited in etched trenches and holes of semiconductor devices with a high depth to width aspect ratio can bridge over the opening causing undesirable cavities in the deposition layer. To prevent such overhang, the sputtered material can be redirected into substantially vertical paths between the target and the substrate by negatively charging the substrate and positioning appropriate vertically oriented electric fields adjacent the substrate if the sputtered material is sufficiently ionized by the plasma. However, material sputtered by a low density plasma often has an ionization degree of less than 10% which is usually insufficient to avoid the formation of overhangs. Accordingly, it is desirable to increase the density of the plasma to increase the ionization rate of the sputtered material in order to decrease unwanted overhang formation in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil induces electromagnetic fields and generates a high density plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

In many high density plasma applications, it is preferable for the chamber to be operated at a relatively high pressure so that the frequency of collisions between the plasma ions or plasma precursor gas atoms and the deposition material atoms is increased to increase thereby the resident time of the sputtered material in the high density plasma zone. As a consequence, the likelihood that deposition material atoms may be ionized is increased thereby increasing the overall ionization rate. However, scattering of the deposition atoms is likewise increased. This scattering of the deposition atoms often causes the thickness of the deposition layer on the substrate to be thicker on that portion of the substrate aligned with the center of the target and thinner in the outlying regions.

In order to improve the uniformity of deposition, the coil which is used to couple RF energy into the plasma has been adapted to sputter material from the coil onto the workpiece to supplement the material being sputtered from a target onto the workpiece. The coil may be positioned adjacent to the substrate so that material sputtered from the coil is deposited primarily onto the periphery of the workpiece. One end of the coil is coupled to an RF generator and the other end of the coil is coupled to the system ground, typically through a blocking capacitor to develop a DC bias on the coil to facilitate sputtering of the coil. If the coil is a single turn coil, the ends of the coil are typically positioned close together but spaced by a gap (typically on the order of ¼ inch (4–8 mm)) to prevent a short between the RF generator and the blocking capacitor which would bypass the coil.

Although sputtering material from the coil onto the workpiece can improve the uniformity of deposition, it has been noted by the present applicants that nonuniformities in the deposition can nonetheless occur. Accordingly, further improvements in deposition uniformity is desired.

SUMMARY OF THE PREFERRED EMBODIMENTS

It is an object of the present invention to provide an improved method and apparatus for generating a plasma within a chamber and for sputter depositing a layer which obviate, for practical purposes, the above-mentioned limitations.

These and other objects and advantages are achieved by, in accordance with one aspect of the invention, a plasma generating apparatus which inductively couples electromagnetic energy and sputters material from a coil which has two spaced but overlapping ends, and a pair of RF feedthroughs connected to the coil ends, also positioned in an overlapping fashion. As a result, the current path around the coil from one feedthrough to the other feedthrough need not have a circumferential or azimuthal gap in the vicinity of the coil ends. It has been recognized by the present applicant that the gap which normally spaces the two RF feedthroughs of a prior single turn coil may cause a nonuniformity in the plasma density which may adversely affect the uniformity of deposition onto the substrate closest to the coil gap as compared to other portions of the substrate. By reducing or eliminating the circumferential gap in the current path at the ends of the coil, it is believed that the coil can provide a more uniform plasma density around the circumference of the coil, even adjacent to the ends.

In several illustrated embodiments, the coil ends and associated RF feedthroughs circumferentially overlap in a direction generally parallel to the axis of the substrate holder and the substrate supported on the holder. In alternative illustrated embodiments, the coil ends can circumferentially overlap in a radial direction. In each of the embodiments described herein below, it is believed that such overlapping of the RF feedthrough positions adjacent to the coil ends can improve the quality of the layer deposited onto the substrate.

DETAILED DESCRIPTION OF THE DRAWINGS

Figure 1:
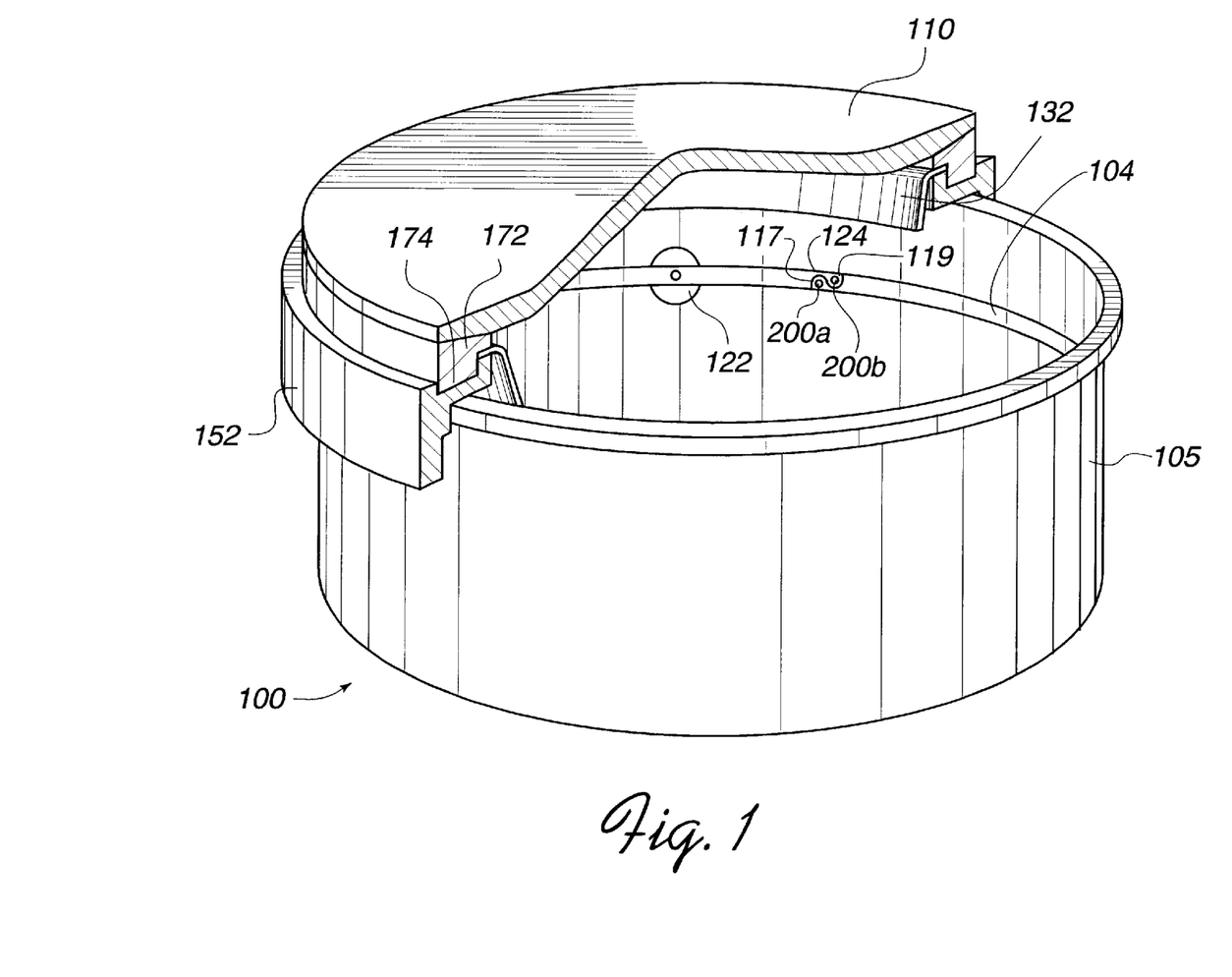
FIG. 1 is a perspective, partial cross-sectional view of a plasma generating chamber in accordance with one embodiment of the present invention.
Figure 2:
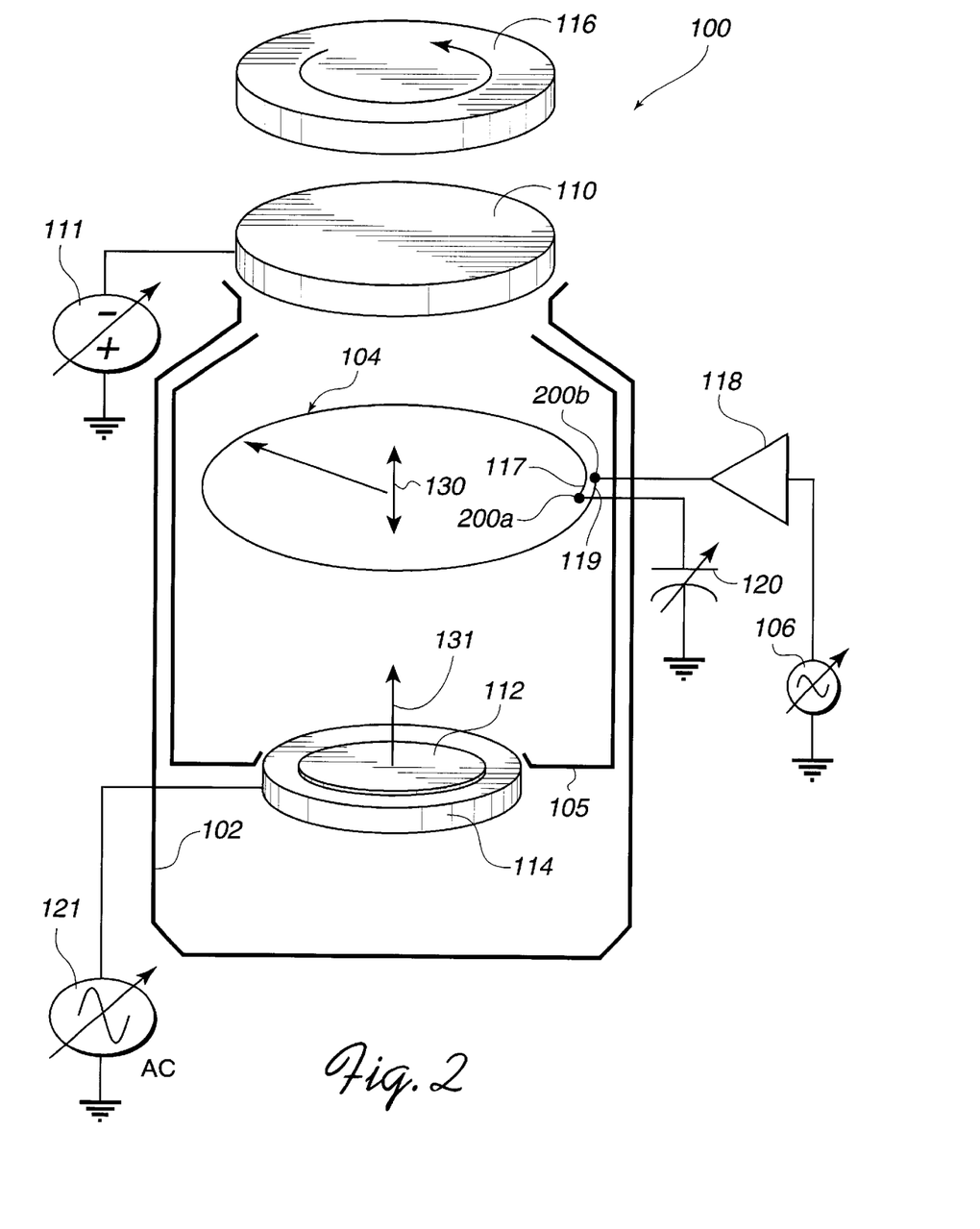
FIG. 2 is a schematic diagram of the electrical interconnections to the plasma generating chamber of FIG. 1.

Referring first to FIGS. 1 and 2, a plasma generator in accordance with a first embodiment of the present invention comprises a substantially cylindrical plasma chamber 100 which is received in a vacuum chamber 102 (shown schematically in FIG. 2). The plasma chamber 100 of this embodiment has a single turn coil 104 which, as described in greater detail below, has overlapping ends and overlapping RF feedthroughs 200a, 200b which permit improved deposition uniformity. The coil 104 is carried internally by a shield 105 which protects the interior walls of the vacuum chamber 102 from the material being deposited within the interior of the plasma chamber 100.

Radio frequency (RF) energy from an RF generator 106 is radiated from the coil 104 into the interior of the deposition system 100, which energizes a plasma within the deposition system 100, to ionize material sputtered from a target 110 positioned at the top of the chamber 102. The target 110 is negatively biased by a DC power source 111 to attract sputtering ions. Ions impacting the target 110 eject material from the target onto a substrate 112 which may be a wafer or other workpiece which is supported by a pedestal 114 at the bottom of the deposition system 100. A rotating magnet assembly 116 provided above the target 110 produces magnetic fields which sweep over the face of the target 110 to promote a uniform or other desired erosion pattern on the target.

As set forth above, the atoms of material ejected from the target 110 are in turn ionized by the plasma being energized by the coil 104 which is inductively coupled to the plasma. The RF generator 106 is preferably coupled to one end 117 of the coil 104 through an amplifier and impedance matching network 118. The other end 119 of the coil 104 is coupled to ground, preferably through a capacitor 120 which may be a variable capacitor. The ionized deposition material is attracted to the substrate 112 and forms a deposition layer thereon. The pedestal 114 may be negatively biased by an RF (or AC or DC) source 121 so as to externally bias the substrate 112.

Material may also be sputtered from the coil 104 onto the substrate 112 to supplement the material which is being sputtered from the target 110 onto the workpiece. As a result, the layer deposited onto the substrate 112 is formed from material from both the coil 104 and the target 110 which can substantially improve the uniformity of the resultant layer. The material sputtered from the target 110 tends to deposit more thickly in the center of the workpiece as compared to the edges. However, the material sputtered from the coil 104 tends to deposit more thickly at the edges of the workpiece as compared to the center of the workpiece. As a consequence, the materials deposited from the coil and the target can combine to form a layer of improved uniform thickness from the center of the workpiece to its edges.

Figure 9:
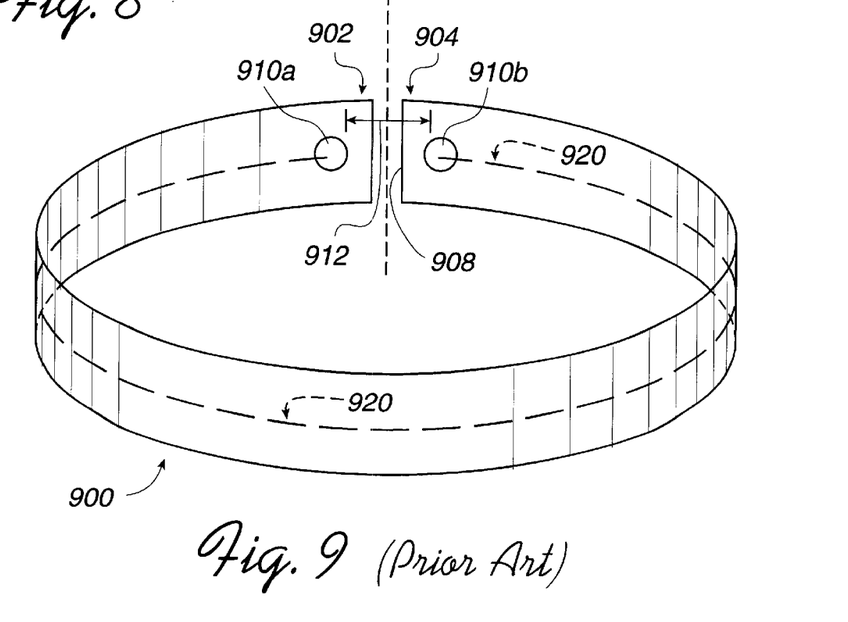
FIG. 9 is a perspective view of a prior coil.

In general, a coil for generating a plasma and for sputtering is designed so that the two ends of the coil do not touch to prevent shorting out the coil. FIG. 9 shows a previous single turn coil 900 having two ends 902 and 904 which are coupled to an RF generator and ground, respectively, by a pair of RF feedthroughs indicated at 910a and 910b, respectively. The two ends 902 and 904 are spaced by a vertical slot 906 which prevents the two ends from shorting. However, it has been recognized by the present applicants that a nonuniformity in the plasma density may exist adjacent to the coil ends 902 and 904. The present invention is directed to reducing or eliminating such non-uniformity adjacent to the coil ends.

The coil 104, in the present embodiment, is carried on the shield 105 by a plurality of coil standoffs 122 (FIG. 1) which electrically insulate the coil 104 from the supporting shield 105. As set forth in greater detail in copending application Ser. No. 08/853,024, entitled "Recessed Coil for Generating a Plasma," filed May 8, 1997 and assigned to the assignee of the present application, the insulating coil standoffs 122 have an internal labyrinth structure which permits repeated deposition of conductive materials from the target 110 onto the coil standoffs 122 while preventing the formation of a complete conducting path of deposited material from the coil 104 to the shield 105 which could short the coil 104 to the shield 105 (which is typically at ground).

RF power is applied to the coil 104 by feedthroughs 200a and 200b which are supported by insulating feedthrough standoffs 124. The feedthrough standoffs 124, like the coil support standoffs 122, permit repeated deposition of conductive material from the target onto the feedthrough standoff 124 without the formation of a conducting path which could short the coil 104 to the shield 105. Thus, the coil feedthrough standoff 124 has an internal labyrinth structure somewhat similar to that of the coil standoff 122 to prevent the formation of a short between the coil 104 and the wall 140 of the shield.

The coil 104 of the illustrated embodiment is made of ½ by ⅛ inch heavy duty solid high-purity (preferably 99.995% pure) titanium ribbon formed into a single turn coil having a diameter of 10–12 inches. However, other highly conductive materials and shapes may be utilized depending upon the material being sputtered and other factors. For example, the ribbon may be as thin as ¹⁄₁₆ inch and exceed 2 inches in height. In general, if the coil material is to be sputtered, both the target and the coil may be made of the same material. In addition to the ribbon shape illustrated, hollow tubing may be utilized, particularly if water cooling is desired. To promote adherence, the coil surface may be treated by known treatments, including acid dipping, surface knurling, or bead blasting.

Figure 3:
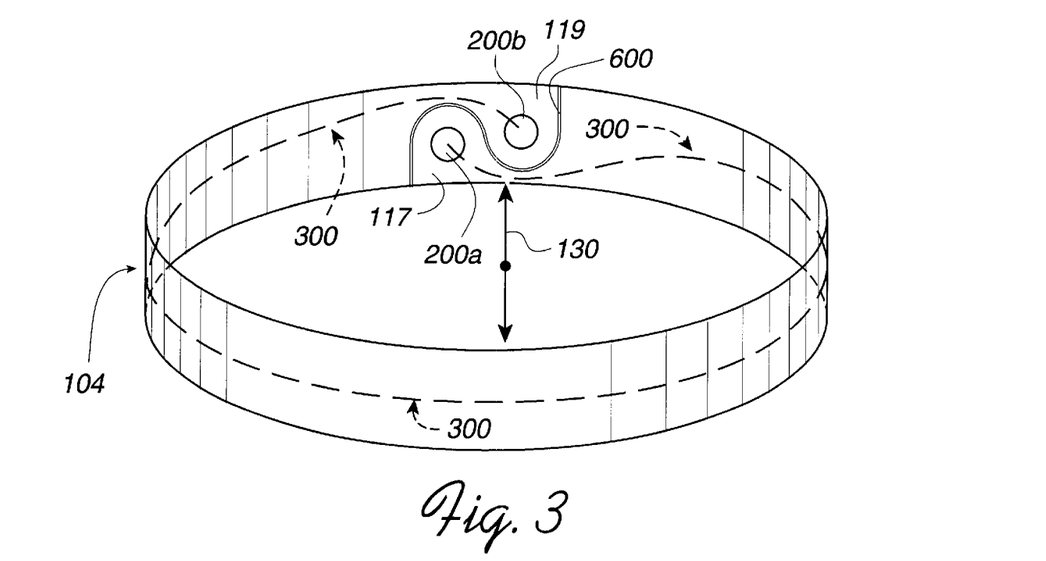
FIG. 3 is a perspective view of a coil having RF feedthroughs positioned in accordance with a first embodiment of the present invention.
Figure 4:
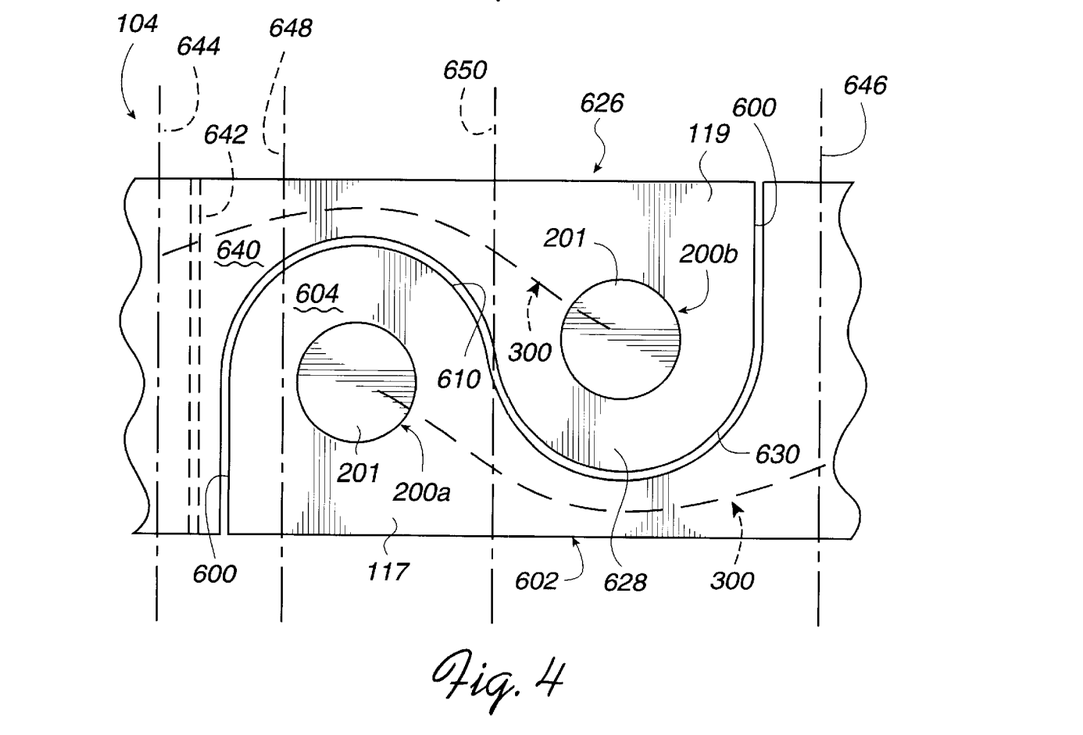
FIG. 4 is a partial elevational view of the coil ends in FIG. 3.

As best seen in FIGS. 3 and 4, and as described in greater detail in copending application Ser. No. 09/039,695, filed Mar. 16, 1998, entitled OVERLAP DESIGN ON ONE-TURN COIL and assigned to the assignee of the present invention, the two ends of a single turn coil may be positioned to be "axially overlapping" to encircle the full circumference of the substrate. The coil 104 of the illustrated embodiment is generally circular and defines a central axis 130 (FIG. 2) which is preferably aligned with the center axis 131 of the substrate and substrate holder. By the term "axially overlapping," it is meant that the coil ends overlap in a direction generally parallel to an axis of the substrate holder, which axis is orthogonal to the surface of the substrate holder carrying the substrate. The substrate holder axis defines the "axial" direction of travel of the deposition material deposited onto the substrate from the coil. In this embodiment, the target, coil, and substrate are all coaxially aligned. However, the present invention is applicable to other embodiments as well in which a source is designed so that the axes of the target, coil, and substrate are all pointing in the same direction, yet offset from each other. In still other embodiments, a source can be designed such that the axes of the target, coil, and substrate are not aligned in any simple manner. Also, the coil may not be circular such that it may not have a central axis of symmetry. However, as used herein, the coil ends are considered to be "axially overlapping" regardless of actual coil to substrate orientation when the coil ends overlap in a direction generally parallel to the substrate holder axis.

As previously mentioned, the two ends 117 and 119 are coupled to the RF generator 106 and system ground, respectively, through RF feedthroughs 200a and 200b, respectively. Each feedthrough includes a conductive connecting member 201 (FIG. 4) which physically attaches to the associated coil end, preferably through an aperture terminal provided in the coil end for that purpose. Other types of connection terminals may be provided on the coil as well. A slot 600 spaces the two ends 117 and 119 to ensure that the coil current path of least resistance and least distance encircles the coil and to prevent a short between the RF generator 106 and the system ground. Because the coil 104 has axially overlapping ends the coil covers the full circumference of the plasma generator area and the substrate. Thus, the coil ends are considered to be circumferentially overlapping as well. In other words, any axial cross-section of the chamber plasma generation area which includes the substrate will also contain a portion of the coil 104 even in the vicinity of the slit. Consequently, a portion of the coil will be aligned with the substrate in every radial direction of the substrate. As a result, it is believed that deposition uniformity will be improved for those portions of the substrate aligned with the slot of the coil. By comparison, an axial cross-section taken along the line 920 within the slot 906 of the conventional coil shown in FIG. 9 will not contain a portion of the conventional coil because the ends of the coil 900 do not overlap. Hence, there may be a higher level of discontinuity in the sputtering rate adjacent the slot 906 as compared to the slot 600 for the coil 104 of FIGS. 3 and 4.

In accordance with the present invention, it has been recognized that plasma density uniformity in the vicinity of the coil ends may be improved by positioning the RF feedthroughs 200a and 200b on the overlapping coil ends 117 and 119, respectively, in such a manner than the RF current path (represented by the dotted line 300) completely encircles the plasma generation area without any azimuthal discontinuity. The RF current is believed to propagate along the surface of the coil. Thus, in one half cycle the current travels from the RF feedthrough 200a, around the circumference of the coil and back to the RF feedthrough 200b as represented by current path 300. (In the other half cycle, the current would travel in the opposite direction from the RF feedthrough 200b, around the coil and back to the feedthrough 200a.) By placing the connection points 201 of the RF feedthroughs 200a and 200b to the coil 104 in the overlapping portions of the coil ends 117 and 119, respectively, the ends of the current path 300 along the coil may be drawn closer together. In this manner, a circumferential or azimuthal gap in the current path which may cause a nonuniformity in the plasma density may be avoided.

By comparison, in the prior art coil 900 of FIG. 9, the ends 902 and 904 of the coil 900 do not overlap and the RF feedthroughs 910a and 910b are not connected to overlapping ends. As a result, the circumferential or azimuthal gap indicated at 912 between the feedthroughs 910a and 910b can cause a similar circumferential or azimuthal gap in the current path 920 around the coil 900 from one feedthrough to the other. It is believed that such a circumferential gap in the coil current path can adversely affect plasma density adjacent to the coil ends with a corresponding adverse effect on deposition uniformity.

FIG. 4 shows a partial elevational view of the coil 104 in the vicinity of the slot 600 between the two ends 117 and 119. The coil end 117 is coupled at a connector member 201 of feedthrough 200a to the RF generator 106 while the coil end 119 is coupled at the connector member 201 of the feedthrough 200b to the blocking capacitor 120. The feedthroughs pass RF power through the shield 105 to the coil 104. The standoffs 124 of the feedthroughs support the coil 104 on the shield 105 but also insulate the coil from the shield.

The coil end 117 has a protruding portion 602 which includes an enlarged end 604, which defines a lateral recess 610 on the upper edge. Conversely, the coil end 119 has a protruding portion 626 with an enlarged end 628 to define a recess 630 on the lower edge.

The two ends 117 and 119 of the coil are overlapped in a spaced interdigitated fashion. More specifically, the protruding portion 602 of the end 117 is received by the recess 630 of the end 119. Similarly, the protruding portion 626 of the end 119 is received by the recess 610 of the end 117. However, every portion of the end 117 is spaced from every portion of the end 119 to form the S-shaped slot 600, so that a short between the RF generator 106 and the system ground can be prevented.

Although the slot 600 separates the two ends 117 and 119, the current path 300 of the coil 104 effectively covers the full circumference of the substrate and the plasma generation area without any gap or break in the circumferential coverage because that portion of the current path 300 extending into the protruding portion 626 of the end 119 overlaps axially with that portion of the current path 300 extending into the protruding portion 602 of the end 117. In other words, every axial cross-section of the coil 104 taken around the full circumference of the plasma generation area contains a portion of the current path 300 of the coil 104. No axial cross section of the coil 104 fails to include a portion of the RF current path 300 of the coil 104.

The interior vertical face 640 of the coil 104 may be subdivided into a plurality of vertical area spanning the full axial width of the coil as represented by a window area 642 indicated in phantom. If the window 642 is centered on an imaginary line 644 spaced from the recess 610 of the coil, the area enclosed by the window 642 overlaps the coil end 117 over the entire extent of the window 642. As a consequence, the density of the current path 300 passing through the window 642 is relatively constant within the vicinity of the imaginary line 644 as compared to similar points around the coil circumference such as adjacent line 646 of end 119. However, if the window 642 is centered over an imaginary line 648 which intersects the recess 610, the area enclosed by the window 642 will not be entirely the surface of the coil end 117 because some of the area in the window 642 will enclose a portion of the slot 600 and a portion of the end 119. Consequently, the current density in that portion of area of the window 642 which coincides with the surface of coil end 117 will be greater adjacent the line 648 than adjacent the line 644. Conversely, the current density in that portion of the window 642 which coincides with the surface of the coil end 119 adjacent the line 648 is relatively small or even zero since the current path 300 into the coil end 119 does not extend substantially past the RF feedthrough 200a. It is believed that the higher current density along the surface of the coil end 117 adjacent the line 648 will substantially compensate for the lower current density along the surface of the coil end 119 adjacent the line 648 such that the plasma density will remain substantially constant. By comparison, however, if a window 642 is centered on the imaginary line 920 in the circumferential gap 912 between the feedthroughs 910a and 910b of a previous coil shown in FIG. 9, the current density for such a window will be zero, or substantially zero, because the feedthroughs lack any circumferential overlap. Consequently, plasma density may vary substantially adjacent the coil ends.

In the embodiment of FIG. 4, the RF feedthroughs 200a and 200b are overlapped in such a fashion that there is an area adjacent the coil ends and between the feedthroughs in which the current path 300 itself substantially overlaps in the circumferential direction. Thus, for example, if a window area 642 were centered over an imaginary line 650 between the feedthroughs and adjacent the coil ends, the current density of the coil end 117 adjacent the line 650 will substantially match the current density of the coil end 119 adjacent the line 650. As a result, the total current density and the resultant plasma density adjacent the coil ends between the RF feedthroughs may be higher than is desired in some applications.

Figure 5:
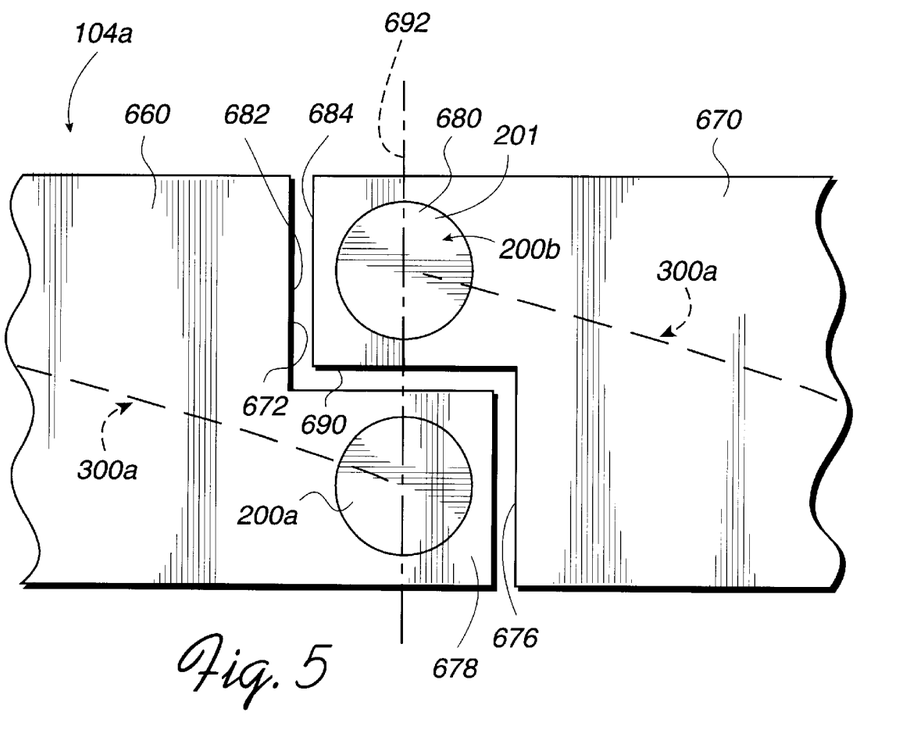
FIG. 5 is a partial elevational view of a coil in accordance with a second embodiment of the present invention.

FIG. 5 shows a partial elevational view of a coil 104a in accordance with a second embodiment of the present invention. The coil 104a is similar to the coil 104 of FIG. 4 except that the coil 104a is shaped differently at two ends 660 and 670 which facilitates overlapping the RF feedthroughs while minimizing overlapping of the current path 300. The coil 104a has complementary notched recess areas 672 and 676 at the two ends 660 and 670, respectively. The end 660 has a protruding portion 678 below the notched recess area 672. Conversely, the end 670 has a protruding portion 680 above the notched recess area 676. The protruding portion 680 of the end 670 is received by the notched recess area 672 of the end 660, and the protruding portion 678 of the end 660 is received by the notched recess area 676 of the end 670. However, every portion of the edge surface 682 of the end 660 is spaced from every portion of the edge surface 684 of the end 670 to form a slit 690 between the surfaces 682 and 684, so that a short between the RF generator 106 and the system ground can be prevented.

In a manner similar to that of the coil 104, the current path 300a of the coil 104a extends around the full circumference of the plasma generation area and the substrate without any substantial gap or break in the circumferential coverage. A circumferential gap is avoided because the connecting members 201 of the RF feedthrough 200a of protruding portion 678 of the end 660 and the RF feedthrough 200b of protruding portion 680 of the end 670 overlap each other axially. Furthermore, overlapping of the current path 300a is minimized by axially aligning the RF feedthrough connecting members as represented by the line 692 which is parallel to the chamber axis 130 (FIG. 2).

Figure 6:
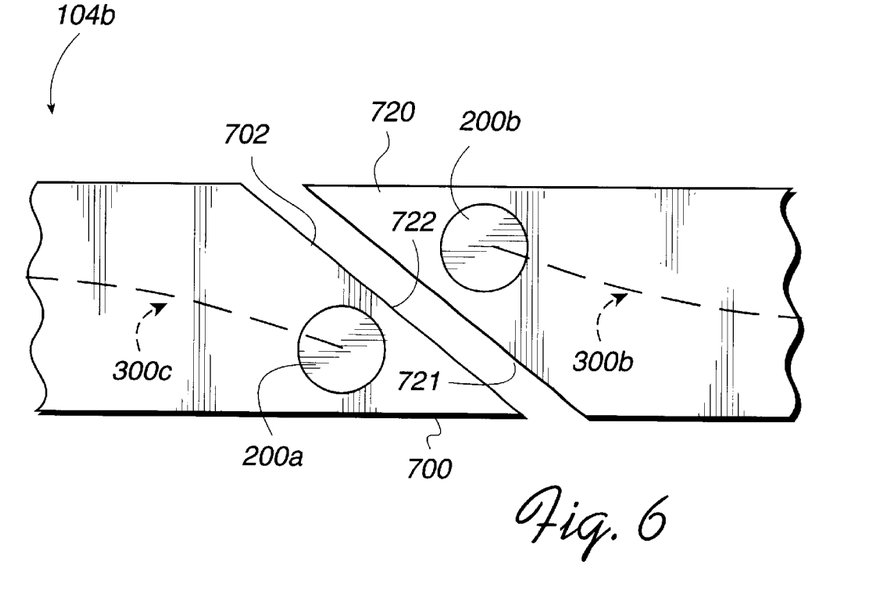
FIG. 6 is a partial elevational view of a coil in accordance with a third embodiment of the present invention.

FIG. 6 shows a partial elevational view of a coil 104b in accordance with a third embodiment of the present invention. The coil 104b is similar to the coil 104a of FIG. 5 in that two ends 700 and 720 of the coil 104b overlap axially so that the coil 104b extends around the full circumference of the plasma generation area without any gap or break in the coverage. However, the coil 104b has the two ends 700 and 720 shaped differently from the two ends of the coil 104a to form a slit 722 which is also shaped somewhat differently from the slit 680 of the coil 104a. The two ends 700 and 720 of the coil 104b are chamfered to have an approximately triangular shape.

The slit 722, which has a shape of a diagonal slanting slope, is formed between the surfaces 702 and 721. The slit 722 spaces the two ends 700 and 720, but, as stated previously, the two ends 700 and 720 overlap axially so that the coil 104b extends around the full circumference of the substrate without any gap or break in the coverage. As with the coils 104 and 104a, the coil 104b will be able to sputter the coil material and couple energy around a full circumference of the plasma generation area because every radial cross-section of the coil 104b taken around the full circumference of the plasma generation area includes a portion of the coil 104b. However, unlike the coil 104a, the RF feedthroughs 200a and 200b of the coil 104b do not substantially circumferentially overlap. Furthermore, the current path 300b does not circumferentially overlap. However, because of the circumferentially overlapping ends 700 and 720 of the coil 104b and because the RF feedthroughs 200a and 200b are not circumferentially aligned, the feedthroughs 200a and 200b may be more readily moved closer together as shown in FIG. 6 as compared to the RF feedthroughs 910a and 910b of the coil 900 depicted in FIG. 9. As shown therein, the feedthroughs 910a and 910b of the coil 900 are circumferentially aligned and the coil ends 902 and 904 do not overlap. As a consequence, any plasma density nonuniformity adjacent the coil ends of the coil 104b is believed to be reduced as compared to that adjacent the ends 902 and 904 of the coil 900 of FIG. 9.

Figure 7:
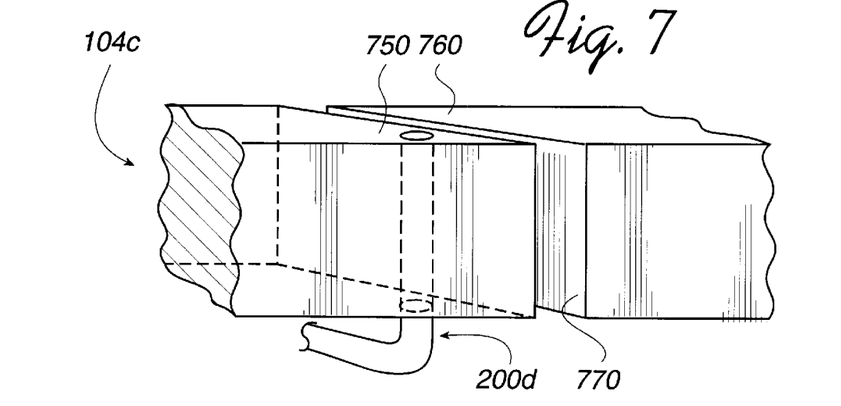
FIG. 7 is a partial perspective view of a coil in accordance with a fourth embodiment of the present invention.
Figure 8:
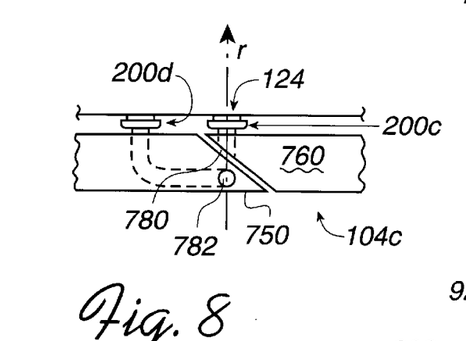
FIG. 8 is a partial top view of the coil of FIG. 6 shown with feedthroughs through an adjacent wall.

FIGS. 7 and 8 show a coil 104c in accordance with a fourth embodiment of the present invention. The coil 104c is different from the previously discussed coils 104, 104a and 104b in FIGS. 4–6 in that two ends 750 and 760 of the coil 104c overlap each other radially instead of overlapping axially like the coils 104, 104a and 104b. In other words, the end 760 is positioned "behind" the end 750 (i.e., between the end 750 and the shield 105) instead of being positioned axially above or below the end 750. Although the two ends of the coil 104c overlap radially instead of axially, the coil 104c still extends around a full circumference of the plasma generation area without any gap or break in the circumferential coverage so that any radial cross-section of the coil 104c taken around this full circumference of the plasma generation area contains a portion of the coil 104c in a manner similar to that of the coils 104, 104a and 104b.

As best seen in FIG. 8, the RF feedthrough 200c connects to the coil end 760 at a connection member 780. The other feedthrough 200d connects to the coil end 750 at connection member 782. To avoid a circumferential gap in the current path and yet reduce current path overlap at the coil ends, it is preferred that the feedthrough connection members 780 and 782 radially overlap and more preferably be radially aligned. In the illustrated embodiment, the connection members 780 and 782 are radially aligned with the feedthrough connection member 782 of the coil end 750 in "front" of the feedthrough connection member 780 of the coil end 760. In this manner, the coil feedthroughs circumferentially overlap but in a radial direction. It should be appreciated that coil ends and coil feedthroughs may be arranged to overlap circumferentially in both radial and axial directions at the same time by orienting the coil end slot in a nonorthogonal direction.

An axially oriented diagonal slit 770 spaces the two ends 750 and 770, so that a short between the RF generator 106 and the system ground can be prevented. Even though the two ends of the coil 104c overlap radially instead of axially, the coil 104c will be able to sputter the coil material and couple energy around a full circumference of the plasma generation area because every radial cross-section of the coil 104c taken around this full circumference of the plasma generation area includes a portion of the coil 104c.

The gap between the coil ends should be sufficiently large to prevent arcing between the two ends which are at substantially different potentials. The gap should also be sufficiently large to prevent deposition material sputtered from the target from bridging between the two ends and electrically shorting the two ends together. On the other hand, the smaller the gap, the smaller the nonuniformity in sputtering rate for those portions of the coil adjacent to the gap. In the illustrated embodiment, the gap of the slot 600 is approximately 4–8 mm, preferably approximately 6 mm. However, it is anticipated that gaps of other sizes may be selected depending upon the particular application as set forth above.

As best seen in FIG. 1, the plasma chamber 100 has a dark space shield ring 132 which provides a ground plane with respect to the target 110 above which is negatively biased. The shield ring 132 shields the outer edges of the target from the plasma to reduce sputtering of the target outer edges.

The plasma chamber 100 is supported by an adapter ring assembly 152 which engages the vacuum chamber. The chamber shield 105 is grounded to the system ground through the adapter ring assembly 152. The dark space shield 132, like the chamber shield 105, is grounded through the adapter ring assembly 152.

The target 110 is generally disk-shaped but may have other shapes. The target is also supported by the adapter ring assembly 152 but is negatively biased and therefore should be insulated from the adapter ring assembly 152 which is at ground. Accordingly, seated in a circular channel formed in the underside of the target 110 is a ceramic insulation ring assembly 172 which is also seated in a corresponding channel 174 in the upper side of the target 152. The insulator ring assembly 172 which may be made of a variety of insulative materials including ceramics spaces the target 110 from the adapter ring assembly 152 so that the target 110 may be adequately negatively biased. The target, adapter and ceramic ring assembly are provided with O-ring sealing surfaces (not shown) to provide a vacuum tight assembly from the vacuum chamber to the target 110.

It should also be recognized that the present invention is applicable to plasma chambers having more than one RF powered coil. For example, the present invention may be applied to multiple coil chambers for launching helicon waves.

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz or 13.56 MHz but it is anticipated that the range can vary from, for example, 0.3 MHz to 60 MHz.

In the illustrated embodiments above, the chamber shield 105 has a diameter of 400 mm (16"), but it is anticipated that satisfactory results can be obtained with a diameter in the range of 150–635 mm (6"–25"). The chamber shield 105 may be fabricated from a variety of materials including insulative materials such as ceramics or quartz. However, the chamber shield 105 and all metal surfaces likely to be coated with the target material are preferably made of a material such as stainless steel or copper, unless made of the same material as the sputtered target material. The material of the structure which will be coated should have a coefficient of thermal expansion which closely matches that of the material being sputtered to reduce flaking of sputtered material from the chamber shield 105 or other structure onto the substrate 112. In addition, the material to be coated should have good adhesion to the sputtered material. Thus for example if the deposited material is titanium, the preferred metal of the chamber shield 105, standoffs 122 and 124 and other structures likely to be coated is titanium. Any surfaces which are more likely to sputter, such as the end caps of the coil and feedthrough standoffs 122 and 124, would preferably be made of the same type of material as the target 110, such as high-purity, surface treated titanium, for example. Of course, if the material to be deposited is a material other than titanium, the preferred metal is the deposited material. Adherence can also be improved by coating non-sputtering structures with molybdenum prior to sputtering the target 110. It is preferred that the coil 104 (or any other surface likely to sputter) not be coated with molybdenum or other materials since the molybdenum can contaminate the substrate 112 if sputtered from the coil 104.

The substrate 112 to target 110 spacing is in a range of about 120–150 mm, preferably about 140 mm (about 5.5"), but can also range from about 38 to 200 mm (1.5" to 8"). For this wafer to target spacing, suitable stepped wafer bottom coverage may be achieved with a coil diameter of 290 mm (11.5 inches) spaced from the target by a distance of approximately 50 mm (1.9 inches). It has been found that increasing the diameter of the coil which moves the coil away from the workpiece edge may have an adverse effect on bottom coverage. On the other hand, decreasing the coil diameter to move the coil closer to the wafer edge can adversely affect layer uniformity.

Deposition uniformity also appears to be a function of coil spacing from the target. As previously mentioned, a spacing of 50 mm (1.9 inches) between the coil and target may be found satisfactory for a target to wafer spacing of 140 mm. Moving the coil vertically either toward or away from the target (or wafer) can adversely affect deposition layer uniformity.

A variety of precursor gases may be utilized to generate the plasma including Ar, $H_2$, $O_2$, and $N_2$ or reactive gases such as $NF_3$, $CF_4$ and many others. Various precursor gas pressures are suitable including pressures of 0.1–50 mTorr. However, pressures between 10 mTorr and 50 mTorr facilitate ionization of sputtered material.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An apparatus for processing a semiconductor workpiece, comprising:

a chamber;

a holder having a surface adapted to support said workpiece within said chamber;

a plasma generation area adjacent said holder and within said chamber;

a coil disposed within said chamber, said coil adapted to inductively couple energy into a plasma in said plasma generation area, said coil having a first end and a second end spaced from said first end, said first end being adjacent to said second end, said coil defining a central axis;

a first RF feedthrough having a first connector member connected at said first end of said coil; and a second RF feedthrough having a second connector member connected at said second end of said coil;

said coil extending around said central axis at least 360 degrees between said first connector member and said second connector member.

2. The apparatus of claim 1 further comprising a sputtering target positioned to sputter deposition material through said plasma generation area to said workpiece.

3. The apparatus of claim 1 wherein said coil is a single turn coil.

4. The apparatus of claim 3, wherein said coil is generally circular in shape and said first RF feedthrough connector member and said second RF feedthrough connector member overlap in a direction parallel to said central axis.

5. The apparatus of claim 3, wherein said first and second ends are chamfered.

6. The apparatus of claim 3, wherein said first end has a first protruding portion and a first recess, and said second end defines a second protruding portion received by but spaced from said first recess, said second end further defining a second recess receiving but spaced from said first protruding portion.

7. The apparatus of claim 6 wherein said first RF feedthrough connector member is connected to said first protruding portion and said second RF feedthrough connector member is connected to said second protruding portion.

8. The apparatus of claim 3, wherein said coil is exposed to said plasma generation area.

9. The apparatus of claim 1, wherein said workpiece holder surface defines an axis generally orthogonal to said workpiece holder surface, and wherein said first RF feedthrough connector member and said second RF feedthrough connector member overlap in a direction generally parallel to said workpiece holder axis.

10. The apparatus of claim 1, wherein said first end has a protruding portion and said second end defines a recess such that said protruding portion is received by but spaced from said recess.

11. The apparatus of claim 1, wherein said coil defines a radius and said second connector member overlaps said first connector member radially.

12. The apparatus of claim 11, wherein said coil is generally circular in shape and defines a central axis and a radius of substantially constant length and orthogonal to said central axis and said second connector member overlaps said first connector member in a radial direction orthogonal to said central axis.

13. The apparatus of claim 11, wherein said first and second ends are chamfered.

14. The apparatus of claim 11, wherein said first end has a protruding portion and said second end defines a recess such that said protruding portion is received by but spaced from said recess.

15. The apparatus of claim 11, wherein said first end has a first protruding portion and a first recess, and said second end defines a second protruding portion received by but spaced from said first recess, said second end further defining a second recess receiving but spaced from said first protruding portion.

16. The apparatus of claim 15 wherein said first RF feedthrough connector member is connected to said first end protruding portion and said second RF feedthrough connector member is connected to said second end protruding portion.

17. The apparatus of claim 1, further comprising a sputter target positioned within said chamber to provide a source of sputtered deposition material wherein said coil is formed of the same type of material as said target and is positioned to sputter said coil material onto said workpiece, and means for biasing said target and coil so that both said coil material and said target material are deposited on said workpiece to form a layer thereon.

18. An apparatus for ionizing deposition material to be deposited onto a workpiece, comprising:

a chamber;

a holder having a surface for supporting said workpiece;

a plasma generation area adjacent said holder;

a single turn coil adapted to inductively couple energy into a plasma in said plasma generation area, said coil being exposed to said plasma generation area and having a first end and a second end spaced from said first end and adjacent thereto;

a first RF feedthrough connected to said first end of said coil; and a second RF feedthrough connected to said second end of said coil and defining a least distance current path along said coil between said first and second RF feedthroughs, said least distance current path extending at least 360 degrees along said coil between said first RF feedthrough and said second RF feedthrough.

19. An apparatus for ionizing deposition material to be deposited onto a workpiece, comprising:

a chamber;

a sputtering target;

a holder having a surface adapted to support said workpiece;

a plasma generation area adjacent said holder;

a single turn coil adapted to inductively couple energy into a plasma in said plasma generation area, said coil having a first end and a second end spaced from but overlapping said first end, wherein said first end has a first protruding portion and a first recess, and said second end defines a second protruding portion received by but spaced from said first recess, said second end further defining a second recess receiving but spaced from said first protruding portion;

a first RF feedthrough connector member connected to said first end protruding portion of said coil in said second recess; and a second RF feedthrough connector member connected to said second end protruding portion of said coil in said first recess.

20. The apparatus of claim 19, wherein said coil is exposed to said plasma generation area.

21. An apparatus for sputtering material onto a workpiece, comprising:

a chamber;

a target disposed in said chamber and adapted to sputter said material onto said workpiece;

a holder for said workpiece;

a generally cylindrical shaped plasma generation area between said target and said holder;

a single turn circular coil adapted to inductively couple energy into a plasma in said plasma generation area, said coil having a first end and a second end spaced from but overlapping said first end, said first end being adjacent to said second end;

a first RF feedthrough having a first connector member connected to said first end of said coil; and a second RF feedthrough having a second connector member connected to said second end of said coil, said coil extending at least 360 degrees around at least a portion of said plasma generation area from said first connector member to said second connector member.

22. A method of processing a semiconductor device, comprising:

supplying a plasma precursor gas to a chamber; and radiating RF energy from a coil positioned in said chamber, said coil having two spaced but overlapping ends adjacent to each other, and into a plasma generation area containing a plasma energized by said coil, said radiating including supplying RF energy to said coil through a first RF feedthrough having a first connector member connected to said first end of said coil, and through a second RF feedthrough having a second connector member connected to said second end of said coil;

wherein a conductive path defined by at least part of said first connector member, at least part of said second connector member, and said coil between said first connector member and said second connector member, extends at least 360 degrees.

23. The method of claim 22 further comprising:

sputtering material from said coil onto said semiconductor device to form a layer of said material on said semiconductor device.

24. The method of claim 22 further comprising:

sputtering material from a target onto said semiconductor device to form a layer of said material on said semiconductor device.

25. The method of claim 22 wherein said coil is a single turn coil.

26. The method of claim 22, wherein said workpiece holder surface defines an axis generally orthogonal to said workpiece holder surface, and wherein said second connector member overlaps said first connector member in a direction generally parallel to said workpiece holder axis.

27. The method of claim 26, wherein said coil is generally circular in shape and defines a central axis and said second connector member overlaps said first connector member in a direction parallel to said central axis.

28. The method of claim 26, wherein said first and second ends are chamfered.

29. The method of claim 26, wherein said first end has a protruding portion and said second end defines a recess such that said protruding portion is received by but spaced from said recess.

30. The method of claim 26, wherein said first end has a first protruding portion and a first recess, and said second end defines a second protruding portion received by but spaced from said first recess, said second end further defining a second recess receiving but spaced from said first protruding portion.

31. The method of claim 30 wherein said first RF feedthrough connector member is connected to said first end protruding portion and said second RF feedthrough connector member is connected to said second end protruding portion.

32. The method of claim 26 wherein said coil encircles said plasma generation area.

33. The method of claim 32, wherein said coil is axially displaced relative to said workpiece holder.

34. The method of claim 22, wherein said coil defines a radius and said second connector member overlaps said first connector member radially.

35. The method of claim 34, wherein said coil is generally circular in shape and defines a central axis and a radius of substantially constant length and orthogonal to said central axis and said second connector member overlaps said first connector member in a radial direction orthogonal to said central axis.

36. The method of claim 34, wherein said first and second ends are chamfered.

37. The method of claim 34, wherein said first end has a protruding portion and said second end defines a recess such that said protruding portion is received by but spaced from said recess.

38. The method of claim 37, wherein said second end has a protruding portion and said first end defines a recess such that said protruding portion of said second end is received by but spaced from said recess of said first end.

39. The method of claim 34, wherein said first end has at least one protruding portion and at least one recess, and said second end has at least one protruding portion and at least one recess such that said protruding portion of said first end is received by said recess of said second end and said protruding portion of said second end is received by said recess of said first end.

40. The method of claim 39 wherein said first RF feedthrough connector member is connected to said first end protruding portion and said second RF feedthrough connector member is connected to said second end protruding portion.

41. The method of claim 34, wherein said first and second ends are chamfered.

42. A method of processing a semiconductor device as in claim 22, wherein said conductive path defined by at least part of said first connector member, at least part of said second connector member, and said coil between said first connector member and said second connector member, extends 360 degrees.

43. A method of depositing deposition material onto a workpiece, comprising:

coupling energy from a coil into a plasma generation area to generate an evenly distributed plasma to ionize said material, said coil covering a full circumference of said plasma generation area and having two spaced but overlapping ends, each end defining a protruding portion and a recess, said radiating including supplying RF energy to said coil through a first RF feedthrough having a first connector member connected to said protruding portion of said first end of said coil, and through a second RF feedthrough having a second connector member connected to said protruding portion of said second end of said coil; and sputtering said material from said coil onto said workpiece to form a layer of said material on said workpiece.

44. The method of claim 43, further comprising positioning said coil to be exposed to said plasma generation area.

45. The method of claim 44, wherein said coil is a single turn coil.

46. A method of processing a semiconductor device, comprising:

supplying a plasma precursor gas to a chamber; and radiating RF energy from a coil disposed in said chamber, said coil having two spaced but overlapping ends adjacent to each other, said ends each including a connection to an RF energy feedthrough, said coil including a least distance current path around said coil from one coil end connection to the other coil end connection, said least distance current path extending at least 360 degrees between said coil end connections.

47. A single turn coil for inductively coupling RF energy into a plasma in a plasma generation area in a semiconductor processing apparatus having first and second RF connectors, comprising:

a conductive member defining a circumference and having a first end and a second end spaced from said first end, said coil having a full axial width;

said first end of said conductive member having a first connection terminal for connecting to a first RF connector; and said second end of said conductive member having a second connection terminal for connecting to a second RF connector, said first and second connection terminals defining a least distance current path extending at least 360° along said coil between said first and second connection terminals, said first connection terminal being spaced a distance less than said full axial width from said second connection terminal.

48. The coil of claim 47, wherein said distance is 4 to 8 mm.

49. A coil for inductively coupling RF energy into a plasma in a plasma generation area in a semiconductor processing apparatus having first and second RF connectors, comprising:

a conductive member defining a diameter and a full axial width, and having a first end and a second end spaced from said first end;

said first end of said conductive member having a first connection terminal adapted to connect to a first RF connector; and said second end of said conductive member having a second connection terminal adapted to connect to a second RF connector, said second connection terminal spaced a distance less than said full axial width from said first connection terminal;

said conductive member defining a radius, said second connection terminal overlapping said first connection terminal in a radial direction.

50. The coil of claim 49, wherein said conductive member comprises a single turn coil and said conductive member is adapted to be exposed to a plasma.

51. A coil for inductively coupling RF energy into a plasma in a plasma generation area in a semiconductor processing apparatus having first and second RF connectors, comprising:

a conductive member defining a circumference and having a first end and a second end spaced from said first end and adjacent thereto; wherein said first end has a first protruding portion and a first recess, and said second end defines a second protruding portion received by but spaced from said first recess, said second end further defining a second recess receiving but spaced from said first protruding portion; and wherein said first protruding portion of said first end of said coil conductive member has a first connection terminal adapted to connect to a first RF connector; and said second protruding portion of said second end of said coil conductive member has a second connection terminal adapted to connect to a second RF connector.

52. An apparatus for processing a workpiece comprising:
a plasma chamber;
a holder having a surface for supporting said workpiece in said plasma chamber;
a plasma generation area adjacent said holder in said plasma chamber;
a coil disposed in said plasma chamber for inductively coupling energy into a plasma in said plasma generation area, said coil having a first end and a second end adjacent said first end;
a first RF feedthrough having a first connecting member connected to said first end of said coil; and
a second RF feedthrough having a second connecting member connected to said second end of said coil;
wherein said coil is generally circular in shape and said first connecting member overlaps said second connecting member in a direction selected from the group consisting of axially overlapping, radially overlapping, and both axially and radially overlapping.

53. An apparatus as in claim 52, wherein said first connecting member is axially overlapping said second connecting member.

54. An apparatus as in claim 52, wherein said first connecting member is radially overlapping said second connecting member.

55. An apparatus as in claim 52, wherein said first connecting member is axially overlapping and radially overlapping said second connecting member.

56. An apparatus for processing a semiconductor workpiece, comprising:
a chamber;
a holder having a surface adapted to support said workpiece within said chamber;
a plasma generation area adjacent said holder and within said chamber;
a coil disposed within said chamber, said coil adapted to inductively couple energy into a plasma in said plasma generation area, said coil having a first end and a second end spaced from said first end, said first end being adjacent to said second end, said coil defining a central axis;
a first RF feedthrough having a first connector member connected at said first end of said coil; and
a second RF feedthrough having a second connector member connected at said second end of said coil;
wherein a conductive path defined by at least part of said first connector member, at least part of said second connector member, and said coil between said first connector member and said second connector member, extends at least 360 degrees.

57. An apparatus as in claim 56, wherein said conductive path defined by at least part of said first connector member, at least part of said second connector member, and said coil between said first connector member and said second connector member, extends 360 degrees.

58. A single turn coil adapted to inductively couple energy into a plasma in a plasma generation area in a chamber, comprising:
said coil having a first end and a second end spaced from said first end, said first end being adjacent to said second end, said coil defining a central axis;
a first RF feedthrough having a first connector member connected at said first end of said coil; and
a second RF feedthrough having a second connector member connected at said second end of said coil;
said coil extending around said central axis at least 360 degrees between said first connector member and said second connector member.

59. A single turn coil as in claim 58, wherein said first and second ends are chamfered.

60. A single turn coil as in claim 58, wherein said first end defines a protruding portion and said second end defines a recess and said protruding portion is received by but spaced apart from said receiving portion.

* * * * *